(12) United States Patent
Thakur

(10) Patent No.: US 6,406,647 B1
(45) Date of Patent: Jun. 18, 2002

(54) METHOD FOR PREPARATION OF SINGLE CRYSTAL FILMS OF ORGANIC SECOND ORDER OPTICAL MATERIALS

(76) Inventor: Mrinal Thakur, 1309 Gatewood Dr. No. 1703, Auburn, AL (US) 36830

( * ) Notice: Subject to any disclaimer, the term of this patent is extended or adjusted under 35 U.S.C. 154(b) by 0 days.

(21) Appl. No.: 09/249,390

(22) Filed: Feb. 12, 1999

Related U.S. Application Data

(60) Provisional application No. 60/074,576, filed on Feb. 13, 1998.

(51) Int. Cl.$^7$ .............................. F21V 9/00; C30B 7/00
(52) U.S. Cl. .......................... 252/582; 252/587; 117/70
(58) Field of Search ................................ 252/582, 587; 359/326, 328; 117/70

(56) References Cited

U.S. PATENT DOCUMENTS

| | | | |
|---|---|---|---|
| 4,793,893 A | | 12/1988 | Thakur et al. ............... 156/622 |
| 5,315,432 A | * | 5/1994 | Ohno .......................... 359/326 |
| 5,385,116 A | * | 1/1995 | Hattori et al. ............... 252/582 |
| 5,412,144 A | | 5/1995 | Stupp et al. ................. 558/406 |
| 5,581,396 A | * | 12/1996 | Kubota et al. ............... 252/582 |
| 5,856,384 A | * | 1/1999 | Garito et al. ................ 252/582 |
| 6,198,530 B1 | * | 3/2001 | Leyderman .................. 359/328 |

FOREIGN PATENT DOCUMENTS

| | | | |
|---|---|---|---|
| JP | 2-175697 | * | 7/1990 |
| JP | 3-059036 | * | 3/1991 |

OTHER PUBLICATIONS

Thakur Et Al., Macromolecules, vol. 18, pp. 2341–2344, (1985).*

Bhowmik Et Al., Polymer Preprints, vol. 39, No. 2, p. 1038, (1998).*

Forrest, et al., "Intense Second Harmonic Generation and Long–Range Structural Ordering in Thin Films of An Organic Salt Grown by Organic Vapor Phase Deposition," Appl. Phys. Lett. 68 (10), Mar. 4, 1996 pp. 1326–1328.

Ledoux, et al., "Highly Efficient Single–Crystalline Organic Thin Films for Quadratic Nonlinear Optics," Optical Engineering, Feb. 1986, vol. 25, No. 2, pp. 202–210.

Burrows, et al., "Organic Vapor Phase Deposition: A New Method for the Growth of Organic Thin Films with Large Optical Non–Linearities," Journal of Crystal Growth, (1995) pp. 91–98.

Quintero–Torres, et al., "Second–harmonic Generation in Single–Crystal Films of an Organic Material," Optical Society of America, 1994, pp. 87–89.

* cited by examiner

Primary Examiner—Philip Tucker
(74) Attorney, Agent, or Firm—Bernstein & Associates, P.C.; Jason A. Bernstein

(57) ABSTRACT

A method for preparation of single crystal films of organic second order optical materials, the films having controlled orientation and thickness. This method produces films of excellent optical quality and with large nonlinearities suitable for device applications. The material of interest is introduced into the interface of two optically flat solid substrates. The substrate surfaces are pretreated so that they are hydrophilic. The material is formed as a liquid phase (highly concentrated solution) in the interface. An external pressure is applied that brings the substrates close together and a shear is applied by moving one substrate with respect to the other while the substrates are held under a constant pressure. As a consequence of these interactions, oriented molecular clusters or nuclei are formed with the molecules organized in a specific direction with respect to the substrate-surface.

22 Claims, 3 Drawing Sheets

(A) NPP (B) COANP (C) APDA (D) DAST (E) PNP (F) 4-Aminobenzophenone (ABP)

(G) SPCD (DMSM)

(H) DEST

METHOD FOR PREPARATION OF SINGLE CRYSTAL FILMS OF ORGANIC SECOND ORDER OPTICAL MATERIALS

CROSS-REFERENCE TO RELATED APPLICATION

This application claims priority of copending provisional patent application Ser. No. 60/074,576, filed, Feb. 13, 1998, entitled METHOD FOR PREPARATION OF SINGLE CRYSTAL FILMS.

FIELD OF THE INVENTION

The present invention relates to organic nonlinear optical crystal, a method of making same, and the materials from which they are made.

BACKGROUND OF THE INVENTION

Organic nonlinear optical crystals are important for many applications. In particular, organic second order optical materials have the potential for a variety of applications in signal processing and other areas of optoelectronics and photonics. Many of these applications require the materials to be in the form of single crystal films. The reason for this is that unless the molecules are organized as, for example, a crystal, the second order optical effect disappears. The thin film form is essential for device applications in optics that require low-loss optical propagation through the film. Therefore, significant attention has been paid by researchers in this field to establish a systematic method for preparation of single crystal thin films of organic second order optical materials. However, efforts to create thin single, crystal films from second order optical organics have largely been unsuccessful.

The major difference between the crystal growth mechanism of an organic material and an inorganic material is that the growth subunits in the case of inorganic materials are atoms whereas the growth subunits of organic systems are molecules. The atomic subunits being spherical in shape, and single-membered units—are easy to arrange within a desired lattice structure. The subunits of organic systems being molecular, contain large numbers of atoms linked together by covalent bonds (e.g., a specific diacetylene molecule (4-BCMU [diacetylene-(4-butoxycarbonyl) methylurethane)]) contains 76 atoms). Such multimembered units usually have complicated shapes and structures that are easily deformable to different conformational states. Therefore, organization of these organic molecules in a specific lattice structure is usually more difficult than that of inorganic materials.

By virtue of the simplicity of the growth mechanisms and shape of the growth subunits, inorganic materials are relatively easy to organize by the epitaxial method, known to those of ordinary skill in the art. Matching of the lattice parameters between a substrate and organizing material provides the required driving potential for the systematic growth. Because of spherical subunits (atoms), most inorganic systems possess cubic unit cells and within the inorganic family usually it is easy to find suitable substrates with appropriate lattice spacings for the epitaxial growth of one member on another. That is why the epitaxial method is so commonly and successfully used in thin film organization of inorganic systems.

Organic molecules (that are solid at room temperature) being large in size, the unit cell dimensions of organic crystals are much larger than that of inorganics (e.g., some diacetylene monomers such as poly(4-BCMU) have lattice spacings more than 3.0 nanometers ("nm")). Because of the structural anisotropy of the molecules organic crystals more commonly possess monoclinic unit cells. If the epitaxial method is to be used it is necessary to obtain a substrate that has a similar molecular and crystal structure as the organizing material. Inorganic materials usually have cubic unit cells and lattice spacings of about 5 nm. Therefore, inorganic substrates are inappropriate for epitaxial growth of an organic material. Within the organic family it is difficult to find a material that can be grown as a large crystal with good optical quality surfaces and can be utilized as a substrate for the epitaxial growth of another organic material. Therefore, the epitaxial method has not been useful for thin film crystal growth of organic materials. Attempts of using epitaxial method have failed to produce large area (i e., >1 mm$^2$) single crystal films of organic materials. These findings show that the principal difficulty in the thin film organization of organics stems from the complicated structures of the molecules. It has not been fruitful to take methods that are specifically devised for inorganics and apply them to organics. For organic materials fundamentally novel approaches have to be identified that would take full advantage of the molecular nature of the subunits.

A method that is well known for providing one-dimensional ordering for specific organic molecules is the Langmuir-Blodget (L-B) method. The polar characteristics of amphiphilic molecules are effectively utilized in this scheme of organization, although the organization is limited to one dimension (perpendicular to the air-water interface) only. It would be desirable to have materials and a method that leads to the successful formation thin single crystal films (three dimensional ordering) with controlled orientation and thickness.

Thin film crystal growth was previously attempted using: (i) deposition from vapor phase, and (ii): slow cooling from melt in a cavity. However, the vapor phase method failed to produce large area samples (i.e., >50 μm) (see, Forrest et al. Appl. Phys. Lett., 68 1326 (1996); Burrows et al., J. Cryst. Growth, 156 91 (1995)). The melt growth method leads to attachment of the material to the cavity surface and the sample can not be used for characterization and application (see, Ledoux et al., Opt. Eng., 25 202 (1986). The melt growth of organic materials often leads to chemical decomposition of the material during the crystal growth. The molten material can become stuck to both substrates and therefore after the solidification step the substrates cannot be separated without damaging the film. In addition, melting usually leads to decomposition of these materials and the films that are produced are not single crystals, but polycrystalline. U.S. Pat. No. 5,412,144 to Stupp et al. describes a method using direct evaporation of solvent to form polycrystalline films having multiple domains. It does not disclose, teach or suggest the formation of single crystal films.

It would be desirable to have a reliable reproducible method for forming single crystal films of a usable size from second order organic materials. Such method would be adaptable for commercial manufacturing operations and industrial applications.

SUMMARY OF THE INVENTION

A novel method has been established for preparation of single crystal films of organic materials. Specifically, this method is applicable to organic second order optical materials which have a wide range of potential applications. This method produces films of excellent optical quality and with large nonlinearities suitable for device applications.

In accordance with a preferred embodiment of the present invention, a single crystal film can be produced from an organic second order optical material produced by a method comprising the steps of: (a) providing an organic second order optical material; (b) dissolving said optical material in a polar solvent so as to form a saturated solution at the temperature that is used for growth of said crystal, said solvent having a boiling point less than about 100° C.; (c) providing at least two substrates; (d) forming hydrophilic surfaces of said at least two substrates; (e) drying said at least two substrates; (f) placing an effective amount of said solution of step b) on one of said at least two substrates; (g) contacting said substrate of step f) so as to form an assembly of substrate-solution-substrate; (h) moving at least one of said at least one substrates of step g) with respect to the other substrate so as to form a generally uniform layer of said solution between said at least two substrates; (i) placing said assembly of step h) is a closed chambers, said chamber being saturated with an effective amount of vapor of said solvent of step b; (j) evaporating at least a portion of said solvent in said chamber and said assembly over an extended period of time; and, (k) removing said assembly from said chamber such that single-crystal film forms on said at least one substrate upon continued evaporation of said solvent.

The present invention also provides single crystal films formed by the process described above.

Other objects, features, and advantages of the present invention will become apparent upon reading the following detailed description of embodiments of the invention, when taken in conjunction with the accompanying drawings and the appended claims.

DESCRIPTION OF THE DRAWINGS

The invention is illustrated in the drawing in which like reference characters designate the same or similar parts throughout the several figures of which.

DESCRIPTION OF THE PREFERRED EMBODIMENTS

Figure 1:
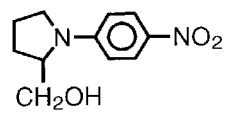
FIG. 1A–H show molecular structures for several materials used in the present invention.
Figure 1:
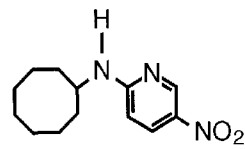
Figure 1:
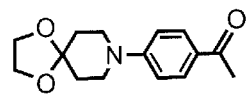
Figure 1:
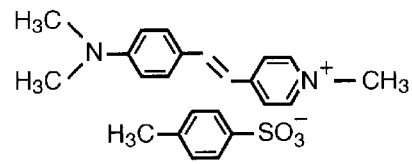
Figure 1:
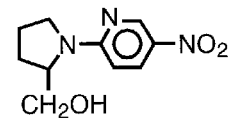
Figure 1:
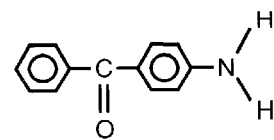
Figure 1:
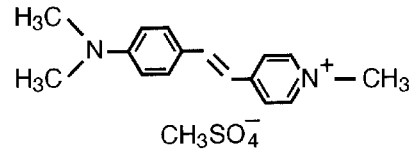
Figure 1:
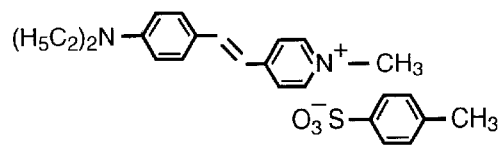

The polar interaction between the organizing molecules and the substrate plays an important role in the method of the present invention. It is desirable that the molecules have polar moieties at one or both ends and the shape of the molecules be elongated (linear, not cyclic), with certain freedom of mobility (torsional) in the structure. Unless the molecules satisfy these conditions the polar interactions may be too weak for the orientation of the molecules to be achieved.

The material of choice is a second order organic material. Such materials are known to those skilled in the art. Examples of such materials are, but are not limited to; N-(4-Nitrophenyl)-L-prolinol (NPP); 2-cyclooctylamino-5-nitropyridine (COANP); 2-(N)-prolinol-5-nitropyridine (PNP); 8-(4'-acetylphenyl)-1,4-dioxa-8-azspiro[4,5]decane (APDA); 4-aminobenzophenone (ABP); 4'-N,N-dimethylamino-4-N-methylstilbazol-ium tosylate (DAST); styrylpyridinium cyanine dye (SPCD); and, diethylamino-stylbazolium tosylate (DEST).

According to the present method, the material of interest is introduced into the interface of two optically flat solid substrates. The substrate material should not be soluble in the solvent used in the crystal growth. It should preferably be polished, with flat surfaces. Substrates usable with the present invention include, but are not limited to, quartz and silicon. The substrate surfaces are pretreated so that they are hydrophilic. The treatment can be with water or sodium hydroxide or other wetting material. The material is formed as a liquid phase (as a highly concentrated solution) in the interface. The concentration should be close to saturation or saturated to obtain the largest area films. However, a lower concentration will also work, but may produce an overall smaller area of film and may take longer to form. The solvent is a polar solvent, such as, but not limited to methanol, acetone, chloroform, tetrahydrofuran, and the like. An external pressure is applied that brings the substrates close together. The pressure is not critical, and can be between 50–200 Pascal. The pressure is somewhat determinative of thickness of the film. A shear is applied by moving one substrate with respect to the other while the substrates are held under a constant pressure. As a consequence of these interactions, oriented molecular clusters or nuclei are formed over time with the molecules organized in a specific direction with respect to the substrate-surface. The orientation of the molecules is determined by the location of polar groups in the molecule and their interaction with the polar substrate used in this crystal growth, i.e., with respect to the molecular axis. The external shear is not essential for the success in this method since the internal shear exerted by the capillary action within the interface between the substrates may be enough for enhancing polar interaction.

The evaporation of the solvent is controlled in a specific way and this is critical for the success of the present invention. Slow evaporation of the solvent subsequently leads to fully oriented single crystal films, as the nuclei grow in size by systematic addition of molecules. Thus, for elongated-shaped molecules with a polar end group, the single crystal films so prepared have a molecular orientation perpendicular to the plane of the film. On the other hand, if the molecule (e.g., NPP) has a polar group (—OH)-oriented sidewise to the molecular axis, then the molecules will be oriented parallel to the film surface.

More specifically the steps involved in this procedure are as follows.

1. The material was dissolved in a polar solvent with a relatively low boiling point.

2. The concentration should be maximized to produce a saturated solution at the temperature that is used for the crystal growth.

3. Two substrates were cleaned thoroughly using oxidizing agents such as hydrogen peroxide and trichloroethylene to remove any organic residue.

4. The substrates were left in distilled water to produce a hydrophilic surfaces. The length of time can be about two hours or more. The length of time is not critical. Sometimes a few drops of NaOH in the distilled water helped in producing the hydrophilicity.

5. The substrates were dried in clean room condition and a few drops of the material solution were placed on one of the substrates and then quickly covering that substrate with another substrate so that a substrate/solution/substrate assembly was formed. This assembly can also be formed via capillary suction of the solution into the interface between the two substrates. One of the substrates was moved with respect to the other. A uniform thin layer of the liquid in intimate contact with both substrates was produced.

6. The substrate/solution/substrate assembly was placed in a closed chamber filled (saturated) with the vapor of the same solvent as is used in Step 1. This vapor was produced by keeping a large quantity of the solvent within the chamber. The substrate/solution/substrate assembly should not be in direct contact with this solvent reserve. The vapor of the solvent filled up the whole chamber and prevented rapid evaporation of the solve from the substrate/solution/ substrate assembly. This step is critical for success in this method of crystal growth. In other words, if all the rest of the steps are followed but step 6 is excluded then the method will not be successful.

7. Over time (approximately 1–4 weeks, depending on the material and conditions), a barrier consisting of solid polycrystalline domains formed all around the solution within the substrate/solution/substrate assembly upon partial and extremely slow evaporation of the solvent. This barrier further reduced the solvent evaporation rate.

8. The assembly was then taken out of the chamber and was left under a clean room condition.

9. The solution bound within the barrier of the polycrystalline domain then progressively led to single crystal films on the substrate as the solvent evaporation continues. Large area single crystal films were obtained as the evaporation becomes complete.

10. The substrates were -then separated, such as by prying or lifting apart using a razor blade or other utensil. Large area (>1 mm$^2$) films were obtained on both substrates. Since the crystal growth was initiated at one of the substrates, the film was usually attached to only one of the substrates. Therefore separation of the substrates did not lead to any damage to the films grown on them.

11. The film on the substrate was subsequently examined under a polarized optical microscope to investigate the crystal quality and homogeneity of the films. Exceptional surface uniformity and excellent optical quality were observed in these films. X-ray diffraction was used to determine the crystal structure and molecular orientation of the films.

12. Nonlinear optical measurements (second harmonic generation, electro-optic studies, nonlinear interferometry) were utilized for detailed optical characterization. The films had significantly larger nonlinear optical susceptibilities compared to commercial materials such as LiNbO$_3$ (lithium niobate) and KDP (potassium dihydrogen phosphate).

The above-stated method was applied to eight important organic second order optical materials, NPP, COANP, DAST, PNP, APDA, ABP, SPCD and DEST (molecular structures of these materials are shown in FIG. 1A–H. Nonlinear optical measurements have shown that the films of these materials have significantly larger second order nonlinearities than commercial materials such as LiNbO$_3$. The single crystal films that were obtained had large area (>5 mm$^2$) with excellent surface uniformity (roughness<20 nm). The measured nonlinearities were very large. The electro-optic coefficients of NPP and DAST films were measured and were found to be much larger than that of LiNbO$_3$. The magnitudes are given in the following.

NPP: $d_{21}$=97pm/V (picometers/volt), $d_{22}$=30pm/V, $d_{eff}^{max}$=97pm/V; $d_{eff}^{max}$ (LiNbO$_3$)=5.65pm/V.

COANP: $d_{32}$=56pm/V, $d_{33}$=4pm/V, $d_{eff}^{max}$=56pm/V; $d_{eff}^{max}$ (LiNbO$_3$)=5.65pm/V.

PNP: $d_{21}$=65pm/V, $d_{22}$=25pm/V, $d_{eff}^{max}$=65pm/V; $d_{eff}^{max}$ (LiNbO$_3$)=5.65pm/V.

APDA: $d_{33}$=61pm/V.

ABP: $d_{23}$=72pm/V.

Electro-optic coefficient of NPP film, $r_{12}$=65 pm/V at 1.064 μm wavelength.

Electro-optic coefficient of DAST, $r_{11}$=530pm/V at 720 nm.

Electro-optic coefficient of commercial material LiNbO$_3$, $r_{33}$=30pm/V.

A wide range of commercial applications in the high speed optical and optoelectronic signal processing technologies are possible using the thin films produced by the present method. Specifically, the potential applications include, but not limited to, frequency conversion, autocorrelation measurement, electro-optic switching and modulation, tunable filters, voltage sensing, parametric amplification and terahertz electrical pulse generation. Second harmonic generation which is a special case of frequency conversion has been demonstrated using the films. The conversion efficiency which is proportional to the square of the d-coefficient is much larger than obtainable in commercial materials such as LiNbO$_3$. The films are ideally suited to autocorrelation measurements for determination of pulsewidths of lasers. Applicability in autocorrelation measurements has been demonstrated using NPP, COANP and ABP films. Electro-optic modulation has been demonstrated for these films. Since the electro-optic coefficients of these films are much larger than that of commercial materials, the drive voltage requirement is low and the device size can be substantially more compact. Using specific geometries such as waveguides and Fabry-Perot interferometer, various devices can be fabricated. Electro-optic modulation in the Fabry-Perot geometry and fabrication of waveguides using the films have been demonstrated. Single-pass thin film electro-optic modulation has been recently demonstrated by using DAST films. The cost for production of these films is significantly lower than that of commercial electro-optic materials and that is an additional advantage in commercial utility of these films.

While the invention has been described in connection with certain preferred embodiments, it is not intended to limit the scope of the invention to the particular forms set forth, but, on the contrary, it is intended to cover such alternatives, modifications, and equivalents as may be included within the spirit and scope of the invention as defined by the appended claims. The invention will be further described in connection with the following examples, which are set forth for purposes of illustration only. Parts and percentages appearing in such examples are by weight unless otherwise stipulated.

EXAMPLES

The organic materials that were used in the Examples which follow were prepared according to literature method. Examples of these methods are found in the following: "Nonlinear Optical Properties of Organic Molecules and Crystals", eds. D. S. Chemla and J. Zyss, Vol. 1, Academic, New York, 1987; S. R. Forrest, P. E. Burrows, A. Stroustrup, D. Strickland and V. S. Ban, Appl. Phys. Lett., 68 1326 (1996); P. E. Burrows, S. R. Forrest, L. S. Sapochak, J. Schwattz, P. Fenter, T. Buma, V. S. Ban and J. L. Forrest, J. Cryst. Growth, 156 91 (1995); I. Ledoux, D. Josse, P. Vidakovic and J. Zyss, Opt. Eng., 25 202 (1986); P. Gunter, Ch. Bosshard, K. Sutter, H. Arend, G. Chapuis, R. J. Twieg and D. Dobrowolsky, Appl. Phys. Lett., 50 486 (1987); and, S. R. Marder, J. W. Perry and C. P. Yakyinyshyn, Chem. Mater., 6 1137 (1994).

Example 1: NPP

The powder of NPP so obtained was recrystallized from acetone. Subsequently, a saturated solution of NPP in acetone at room temperature was prepared. This solution was then used for the crystal growth. A few drops (~100 microliter) of this solution was incorporated between two optically flat quartz substrates (4 in. diameter). A thin uniform liquid layer was obtained at the interface between the two substrates. This substrate/solution/substrate assembly was then placed within the controlled evaporation chamber discussed hereinabove. This step was critical. Thin uniform single crystal film (yellow color, 1.5 cm$^2$ in area and 3 microns in thickness) was obtained at the interface after about 2–3 weeks. The film was inspected under a polarized optical microscope and also by x-ray diffraction which confirmed the single crystal organization. Detailed second harmonic generation experiments were completed using the films. Very large second order susceptibilities and electro-optic coefficients have been measured.

Example 2: COANP

The material was recrystallized from acetone. Subsequently, a saturated solution of COANP in acetone at room temperature was prepared. This solution was then used for the crystal growth. A few drops (~100 microliter) of this solution was incorporated between two optically flat quartz substrates (4 in. diameter). A thin uniform liquid layer was obtained at the interface between the two substrates. This substrate/solution/substrate assembly was then placed within the controlled evaporation chamber as discussed hereinabove. This step was critical. Thin uniform single crystal film (yellow color, 4 cm$^2$ in area and 3.5 microns in thickness) was obtained at the interface after about 2–3 weeks. The film was inspected under a polarized optical microscope and also by x-ray diffraction which confirmed the single crystal organization. Detailed second harmonic generation experiments were completed using the films. Very large second order susceptibilities and electro-optic coefficients have been measured.

Figure 2:
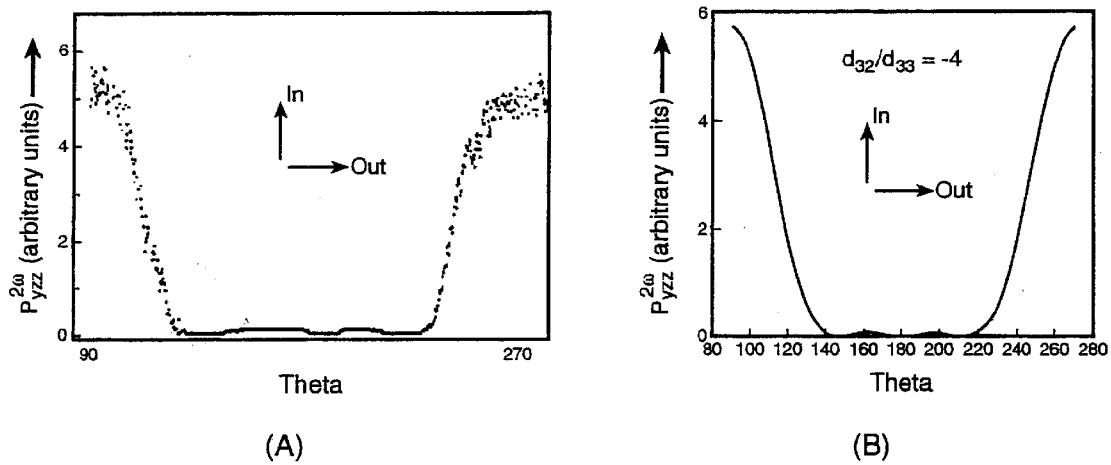
FIGS. 2A and 2B are graphs illustrating measurement results for films formed from COANP.

The experimental results for second harmonic generation in a thin single crystal film of COANP are given in FIGS. 2A and 2B. FIG. 2A measured second harmonic power, $p_{yzz}(2\omega)$ for a COANP film as a function of angle of rotation of the film around the beam propagation direction. The input and output polarization's are perpendicular to each other. FIG. 2B shows calculated second harmonic power as a function of angle of rotation.

These measurements were made for a an input wavelength of 1.06 $\mu$m using 10 ps pulses from a Nd:YAG laser. The measurement showed a $d_{eff}^{max}$=56 pm/V. $d_{32}$=56 pm/V and $d_{33}$=14 pm/V. Second harmonic generation measurements in the films of other materials were made in a similar way.

Example 3: PNP

The powder of PNP so obtained was recrystallized from acetone solution. Subsequently, a saturated solution of PNP in acetone at room temperature was prepared. This solution was then used for the crystal growth. A few drops (~100 microliter) of this solution was incorporated between two optically flat quartz substrates. A thin uniform liquid layer was obtained at the interface between the two substrates. This substrate/solution/substrate assembly was then placed within the controlled evaporation chamber. Thin uniform single crystal film (yellow color, 1.5 cm$^2$ in area and 2.5 microns in thickness) was obtained at the interface after about three weeks. The film was inspected under a polarized optical microscope and also by x-ray diffraction which confirmed the single crystal organization. Detailed second harmonic generation experiments were completed using the films. Very large second order susceptibilities and electro-optic coefficients have been measured.

Example 4: DAST

The material was recrystallized from methanol solution. Subsequently, a saturated solution of DAST in methanol at room temperature was prepared. This solution was then used for the crystal growth. A few drops (~100 microliter) of this solution was incorporated between two optically flat quartz substrates. A thin uniform liquid layer was obtained at the interface between the two substrates. This substrate/solution/substrate assembly was then placed within the controlled evaporation chamber, as discussed hereinabove. This step was critical. Thin uniform single crystal film (color—green in reflection, 30–40 mm$^2$ in area and 3 microns in thickness) was obtained at the interface after about 2–3 weeks. The film was inspected under a polarized optical microscope and also by x-ray diffraction which confirmed the single crystal organization. Detailed second harmonic generation experiments were completed using the films. Very large second order susceptibilities and electro-optic coefficients have been measured.

Electro-optical measurements in a single crystal film of DAST at 720 nm wavelength were made by Mach-Zehnder interferometry and detection of field-induced birefringence. The measurement results showed that the film has an extremely large electro-optic coefficient. The magnitude of $r_{11}$=530 pm/V. The thin films allowed recording the optical absorption spectrum.

Figure 3A:
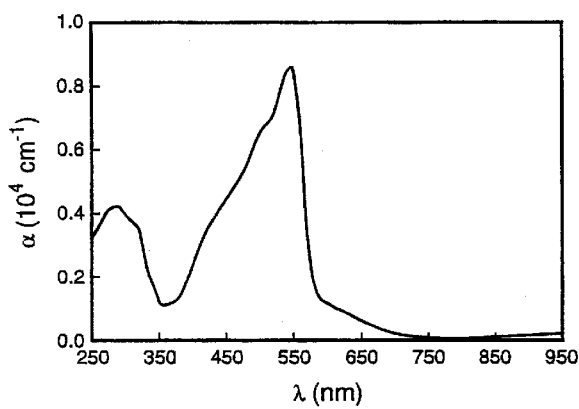
FIGS. 3A and 3B are graphs illustrating measurement results for films formed from DAST.
Figure 3B:
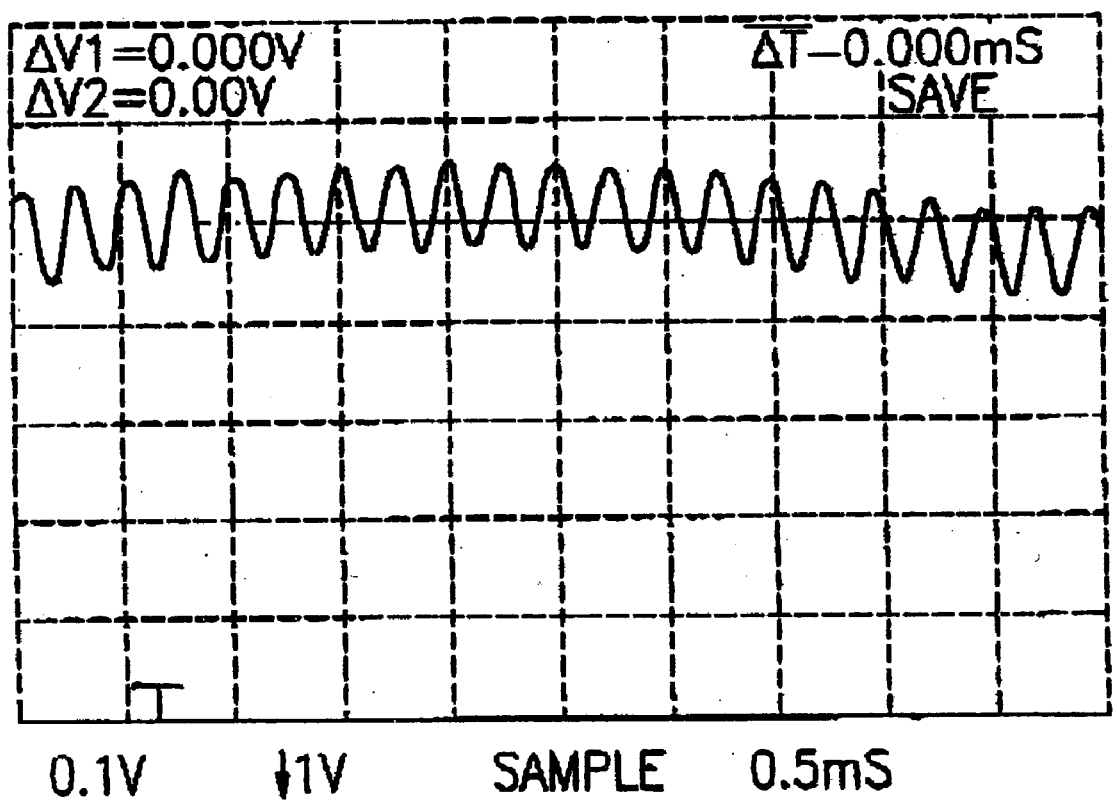

FIGS. 3A and 3B show measurements of a single-pass electro-optic modulation. FIG. 3A is an optical absorption spectrum of a single crystal film (3 $\mu$m thick) of DAST. FIG. 3B is an oscilloscope trace showing electro-optic modulation for a single-pass through the film when an AC field (1V/$\mu$m) at 4 kHz is applied along the dipole axis (a-axis) of the film. The modulation depth is about 20%. This is the first time such a modulator has been demonstrated. The availability of high quality single crystal film and the exceptionally large electro-optic coefficient of the film have been the key to such a demonstration. The modulation depth is about 20% at an AC field of 1 V/$\mu$m (frequency 4 kHz). this result opens the possibility of high-speed electro-optic devices for single-pass or reflective mode operation rather than in the waveguides. However, application in the waveguide configuration is also certainly possible at a short guided-wave interaction length.

Example 5: APDA

The powder of APDA was recrystallized from acetone. Subsequently, a saturated solution of APDA in acetone at room temperature was prepared. This solution was then used for the crystal growth. A few drops (~100 microliter) of this solution was incorporated between two optically flat quartz substrates. A thin uniform liquid layer was obtained at the interface between the two substrates. This substrate/solution/substrate assembly was then placed within the controlled evaporation chamber, as discussed hereinabove. This step was critical. Thin uniform single crystal film (colorless, 1 cm$^2$ in area, 2.5 microns thick) was obtained at the interface after 2–3 weeks. The film was inspected under a polarized optical microscope and also by x-ray diffraction which confirmed the single crystal organization. Detailed second harmonic generation experiments were completed using the films. Very large second order susceptibilities and electro-optic coefficients have been measured.

Example 6: ABP

The powder of ABP so obtained was recrystallized from acetone. Subsequently, a saturated solution of ABP in acetone at room temperature was prepared. This solution was then used for the crystal growth. A few drops (~100 microliter) of this solution was incorporated between two optically flat quartz substrates. A thin uniform liquid layer was obtained at the interface between the two substrates. This substrate/solution/substrate assembly was then placed within the controlled evaporation chamber, as discussed hereinabove. This step was critical. Thin uniform single crystal film (colorless, 2 cm$^2$ in area, 2 microns thick) was obtained at the interface. The film was inspected under a polarized optical microscope and also by x-ray diffraction which confirmed the single crystal organization. Detailed second harmonic generation experiments were completed using the films. Very large second order susceptibilities and electro-optic coefficients have been measured.

DAST was synthesized following literature method. The material was recrystallized from methanol solution. Subsequently a saturated solution of DAST in methanol at room temperature was prepared. This solution was then used for the crystal growth. A few drops (~100 microliter) of this solution was incorporated between two optically flat quartz substrates. A thin uniform liquid layer was obtained at the interface between the two substrates. This substrate/solution/substrate assembly was then placed within the controlled evaporation chamber, discussed in the procedure section. This step was critical. Thin uniform single crystal film (color—green in reflection, 20–30 mm$^2$ in area and 3 microns in thickness) was obtained at the interface after about 3–4 weeks. The film was inspected under a polarized optical microscope and also by x-ray diffraction which confirmed the single crystal organization. Detailed electro-optic measurements on these films have been completed. Very large electro-optic coefficients have been measured. The magnitude of $r_{11}$ is about 530 pm/V at 720 nm wavelength.

Example 7: SPCD

The material was recrystallized from methanol solution. Subsequently, a saturated solution of SPCD in methanol at room temperature was prepared. This solution was then used for the crystal growth. A few drops (~100 microliter) of this solution was incorporated between two optically flat quartz substrates. A thin uniform liquid layer was obtained at the interface between the two substrates. This substrate/solution/substrate assembly was then placed within the controlled evaporation chamber, discussed hereinabove. This step was critical. Thin uniform single crystal film (color—green in reflection, 25–30 mm$^2$ in area and 2–6 microns in thickness) was obtained at the interface after about 3–4 weeks. The film was inspected under a polarized optical microscope and also by x-ray diffraction which confirmed the single crystal organization. Detailed electro-optic measurements on these films have been completed. Very large electro-optic coefficients have been measured. The magnitude of $r_{11}$ is about 510 pm/V at 720 nm wavelength.

Example 8: DEST

The material was recrystallized from methanol solution. Subsequently, a saturated solution of DEST in methanol at room temperature was prepared. This solution was then used for the crystal growth. A few drops (~100 microliter) of this solution was incorporated between two optically flat quartz substrates. A thin uniform liquid layer was obtained at the interface between the two substrates. This substrate/solution/substrate assembly was then placed within the controlled evaporation chamber, discussed hereinabove. This step was critical. Thin uniform single crystal film (color—green in reflection, 20–30 mm$^2$ in area and 2–6 microns in thickness) was obtained at the interface after about 3–4 weeks. The film was inspected under a polarized optical microscope and also by x-ray diffraction which confirmed the single crystal organization. Detailed electro-optic measurements on these films have been completed. Very large electro-optic coefficients have been measured. The magnitude of $r_{11}$ is about 450 pm/V at 720 nm wavelength. Thus the industrial applicability of the films have been demonstrated.

Examples 9–14

All the above experiments were repeated with an additional step of introducing a shear via moving one of the substrates with respect to the other prior to placing the substrate/solution/substrate assembly inside the evaporation chamber. The resulting films were of equal or better quality and had equal or larger areas than the corresponding films without applying the shear.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. All patents, applications, publications and references are incorporated by reference herein in their entirety.

I claim:

1. A single crystal film capable of existing on a single substrate and formed from an organic second order optical material, said organic second order optical material selected from the group consisting of NPP, DAST, PNP, APDA, ABP, SPCD and DEST, wherein said film has an area of at least about 5 mm$^2$ and a surface uniformity of less than about 20 nm.

2. The single crystal film of claim 1, wherein the time to form said crystal is between about one week and about four weeks.

3. The single crystal film of claim 1, wherein said film has an electro-optical coefficient of from about 10 pm/V to about 530 pm/V.

4. The single crystal film of claim 1, wherein said film has a second order susceptibility of $d_{eff}$ is between about 7.2 pm/V to about 1500 pmV.

5. The single crystal film of claim 1, wherein said film has a thickness of from about 0.1 µm to about 20 µm.

6. A method of producing a single crystal film from an organic second order optical material, comprising:

a. providing an organic second order optical material selected from the group consisting of NPP, COANP, DAST, PNP, APDA, ABP, SPCD and DEST;

b. dissolving said optical material in a polar solvent so as to form a saturated solution at the temperature that is used for growth of said crystal, said solvent having a boiling point less than about 100° C.;

c. providing at least two substrates;

d. forming hydrophilic surfaces on said at least two substrates;

e. drying said at least two substrates;

f. placing an effective amount of said solution of step b) on one of said at least two substrates;

g. contacting said substrate of step f) so as to form an assembly of substrate-solution-substrate;

h. moving at least one of said at least one substrates of step g) with respect to the other substrate so as to form a generally uniform layer of said solution between said at least two substrates;

i. placing said assembly of step h) is a closed chamber, said chamber being saturated with an effective amount of vapor of said solvent of step b;

j. evaporating at least a portion of said solvent in said chamber and said assembly over an extended period of time; and, k. removing said assembly from said chamber such that single crystal film material forms on said at least one substrate upon continued evaporation of said solvent.

7. The method of claim 6, further comprising step 1) separating said at least two substrates.

8. The method of claim 6, wherein said polar solvent is selected from the group consisting of methanol, acetone, chloroform, and tetrahydrofuran.

9. The method of claim 6, wherein in step d) said hydrophilic surface is obtained by contacting said substrates with at least one material selected from the group consisting of water and NaOH.

10. The method of claim 6, wherein in step j) said time is between about two weeks and about four weeks.

11. The method of claim 6, wherein the time to form said crystal is between about one week and about four weeks.

12. The method of claim 6, wherein said film has an electro-optical coefficient of from about 10 pm/V to about 530 m/V.

13. The method of claim 6, wherein said film has an area of at least about 5 mm$^2$ and a surface uniformity of less than about 20 nm.

14. The method of claim 6, wherein said film has a second order susceptibility of $d_{eff}$ is between about 7.2 pm/V to about 1500 pmV.

15. The method of claim 6, wherein said film has a thickness of from about 0.1 $\mu$m to about 20 $\mu$m.

16. A single crystal film produced from an organic second order optical material produced by a method comprising the steps of:

a. providing an organic second order optical material, selected from the group consisting of NPP, DAST, PNP, APDA, ABP, SPCD and DEST;

b. dissolving said optical material in a polar solvent so as to form a saturated solution at the temperature that is used for growth of said crystal, said solvent having a boiling point less than about 100° C.;

c. providing at least two substrates;

d. forming hydrophilic surfaces on said at least two substrates;

e. drying said at least two substrates;

f. placing an effective amount of said solution of step b) on one of said at least two substrates;

g. contacting said substrate of step f) so as to form an assembly of substrate-solution-substrate;

h. moving at least one of said at least one substrates of step g) with respect to the other substrate so as to form a generally uniform layer of said solution between said at least two substrates;

i. placing said assembly of step h) is a closed chamber, said chamber being saturated with an effective amount of vapor of said solvent of step b);

j. evaporating at least a portion of said solvent in said chamber and said assembly over an extended period of time;

k. removing said assembly from said chamber such that single crystal film forms on said at least one substrate upon continued evaporation of said solvent; and, l. separating said at least two substrates without causing appreciable damage to said single crystal film such that said single crystal film can exist on a single substrate, wherein said single crystal film of step 1. has an area of at least about 5 mm$^2$ and a surface uniformity of less than about 20 nm.

17. The single crystal film of claim 16, wherein said film has an electro-optical coefficient of from about 10 pm/V to about 530 pm/V.

18. The single crystal film of claim 16, wherein said film has a second order susceptibility of $d_{eff}$ is between about 7.2 pm/V to about 1500 pmV.

19. The single crystal film of claim 16, wherein said film has a thickness of from about 0.1 $\mu$m to about 20 $\mu$m.

20. A single crystal film produced from an organic second order optical material produced by a method comprising the steps of:

a. providing an organic second order optical material, selected from the group consisting of DAST, PNP, APDA, ASP, SPCD and DEST;

b. dissolving said optical material in a polar solvent so as to form a saturated solution at the temperature that is used for growth of said crystal, said solvent having a boiling point less than about 100° C.;

c. providing at least two substrates;

d. forming hydrophilic surfaces on said at least two substrates;

e. drying said at least two substrates;

f. placing an effective amount of said solution of step b) on one of said at least two substrates;

g. contacting said substrate of step f) so as to form an assembly of substrate-solution-substrate;

h. moving at least one of said at least one substrates of step g) with respect to the other substrate so as to form a generally uniform layer of said solution between said at least two substrates;

i. placing said assembly of step h) is a closed chamber, said chamber being saturated with an effective amount of vapor of said solvent of step b);

j. evaporating at least a portion of said solvent in said chamber and said assembly over an extended period of time;

k. removing said assembly from said chamber such that single crystal film forms on said at least one substrate upon continued evaporation of said solvent, and, l. separating said at least two substrates without causing appreciable damage to said single crystal film such that said single crystal film can exist on a single substrate, wherein said single crystal film of step 1. has an area of at least about 5 mm$^2$ and a surface uniformity of less than about 20 nm.

21. A single crystal film/contained on a single substrate and formed from an organic second order optical material, said organic second order optical material selected from the group consisting of DAST, PNP, APDA, ABP, SPCD and DEST, wherein said film has an area of at least about 5 mm$^2$ and a surface uniformity of less than about 20 nm.

22. A single crystal film contained on a single substrate and produced from an organic second order optical material produced by a method comprising the steps of:

a. providing an organic second order optical material, selected from the group consisting of DAST, PNP, APDA, ABP, SPCD and DEST;

b. dissolving said optical material in a polar solvent so as to form a saturated solution at the temperature that is used for growth of said crystal, said solvent having a boiling point less than about 100° C.;

c. providing at least two substrates;

d. forming hydrophilic surfaces on said at least two substrates;

e. drying said at least two substrates;

f. placing an effective amount of said solution of step b) on one of said at least two substrates;

g. contacting said substrate of step f) so as to form an assembly of substrate-solution-substrate;

h. moving at least one of said at least one substrates of step g) with respect to the other substrate so as to form a generally uniform layer of said solution between said at least two substrates;

i. placing said assembly of step h) is a closed chamber, said chamber being saturated with an effective amount of vapor of said solvent of step b);

j. evaporating at least a portion of said solvent in said chamber and said assembly over an extended period of time; and, k. removing said assembly from said chamber such that single crystal film forms on said at least one substrate upon continued evaporation of said solvent, wherein said film of step k. has an area of at least about 5 $mm^2$ and a surface uniformity of less than about 20 nm.

* * * * *